US009773970B2

(12) United States Patent
Mather et al.

(10) Patent No.: US 9,773,970 B2
(45) Date of Patent: *Sep. 26, 2017

(54) MAGNETIC FIELD SENSOR

(71) Applicant: EVERSPIN TECHNOLOGIES, INC., Chandler, AZ (US)

(72) Inventors: Phillip Mather, Phoenix, AZ (US); Jon Slaughter, Tempe, AZ (US); Nicholas Rizzo, Gilbert, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/041,178

(22) Filed: Feb. 11, 2016

(65) Prior Publication Data

US 2016/0163962 A1 Jun. 9, 2016

Related U.S. Application Data

(60) Continuation of application No. 14/521,213, filed on Oct. 22, 2014, now Pat. No. 9,276,200, which is a
(Continued)

(51) Int. Cl.
*H01L 29/82* (2006.01)
*H01L 43/02* (2006.01)
(Continued)

(52) U.S. Cl.
CPC ............ *H01L 43/02* (2013.01); *G01R 33/098* (2013.01); *H01L 27/22* (2013.01); *H01L 43/08* (2013.01); *H01L 43/12* (2013.01)

(58) Field of Classification Search
CPC ......... H01L 43/02; H01L 43/08; H01L 43/12; H01L 43/10; G01R 33/098; G01R 33/093;
(Continued)

(56) References Cited

U.S. PATENT DOCUMENTS 5,793,697 A * 8/1998 Scheuerlein ........... B82Y 10/00
257/E21.665
5,969,978 A * 10/1999 Prinz ..................... H01L 27/222
257/E27.005
(Continued)

FOREIGN PATENT DOCUMENTS

CN 1513120 A 7/2004
CN 101068036 A 11/2007

OTHER PUBLICATIONS

International Search Report in PCT International Application No. PCT/US2012/023363, mailed May 11, 2012.
(Continued)

*Primary Examiner* — Yosef Gebreyesus
(74) *Attorney, Agent, or Firm* — Bookoff McAndrews, PLLC

(57) ABSTRACT

A magnetic field sensor including a first plurality and a second plurality of magnetoresistive sensors, wherein each magnetoresistive sensor of the first plurality and the second plurality of magnetoresistive sensors comprises: an electrode; a reference layer adjacent to the electrode, wherein the reference layer includes a synthetic antiferromagnetic structure; a magnetic sense element; and an intermediate layer between the reference layer and the magnetic sense element; and one or more conductors configured to electrically couple the magnetoresistive sensors of the first plurality and the second plurality in various configurations.

22 Claims, 11 Drawing Sheets

Related U.S. Application Data division of application No. 13/211,118, filed on Aug. 16, 2011, now Pat. No. 8,890,266.

(60) Provisional application No. 61/438,007, filed on Jan. 31, 2011.

(51) Int. Cl.
  *G01R 33/09* (2006.01)
  *H01L 27/22* (2006.01)
  *H01L 43/08* (2006.01)
  *H01L 43/12* (2006.01)

(58) Field of Classification Search
  CPC ......... G01R 33/09; G11C 11/14; G11C 11/16; G11C 11/161; G11C 11/1673; B82Y 25/00
  See application file for complete search history.

(56) References Cited

U.S. PATENT DOCUMENTS

| | | | |
|---|---|---|---|
| 6,331,943 B1 | 12/2001 | Naji et al. | |
| 6,480,411 B1 | 11/2002 | Koganei | |
| 6,704,220 B2* | 3/2004 | Leuschner | G11C 11/16 257/E27.005 |
| 6,756,782 B2* | 6/2004 | Van Zon | G01R 33/09 324/207.12 |
| 7,349,235 B2* | 3/2008 | Miyatake | G11C 11/16 365/100 |
| 7,635,974 B2 | 12/2009 | Guo et al. | |
| 7,911,833 B2 | 3/2011 | Amin et al. | |
| 7,965,077 B2 | 6/2011 | Engel et al. | |
| 8,890,266 B2* | 11/2014 | Mather | G01R 33/098 257/421 |
| 2002/0006017 A1* | 1/2002 | Adelerhof | G01D 5/145 360/315 |
| 2002/0145835 A1 | 10/2002 | Suzuki et al. | |
| 2003/0031046 A1 | 2/2003 | Hidaka | |
| 2003/0169620 A1 | 9/2003 | Sharma et al. | |
| 2004/0125673 A1* | 7/2004 | Daughton | G11C 11/15 365/200 |
| 2005/0100930 A1 | 5/2005 | Wang et al. | |
| 2005/0185453 A1 | 8/2005 | Tran et al. | |
| 2006/0262458 A1 | 11/2006 | Carey et al. | |
| 2008/0151608 A1 | 6/2008 | Hosotani et al. | |
| 2009/0059444 A1 | 3/2009 | Mather et al. | |
| 2009/0243607 A1 | 10/2009 | Mather et al. | |
| 2009/0279212 A1* | 11/2009 | Engel | B82Y 25/00 360/314 |
| 2010/0001723 A1 | 1/2010 | Van Zon et al. | |
| 2010/0013035 A1 | 1/2010 | Ruehrig et al. | |
| 2010/0213933 A1 | 8/2010 | Mather et al. | |
| 2010/0277971 A1 | 11/2010 | Slaughter et al. | |
| 2015/0044782 A1 | 2/2015 | Mather et al. | |

OTHER PUBLICATIONS

Supplementary European Search Report issued in corresponding International Application No. 12742524.7, mailed Jul. 24, 2015 (5 pages).

The International Bureau of WIPO, International Preliminary Report on Patentability in PCT International Application No. PCT/US2012/023363, mailed Aug. 15, 2013.

Non-final Office Action mailed Apr. 4, 2014, in U.S. Appl. No. 13/211,118.

* cited by examiner

MAGNETIC FIELD SENSOR

CROSS-REFERENCE TO RELATED APPLICATIONS

This application is a continuation of pending U.S. application Ser. No. 14/521,213, filed Oct. 22, 2014, which is a divisional of U.S. application Ser. No. 13/211,118, filed Aug. 16, 2011 (now, U.S. Pat. No. 8,890,266, issued on Nov. 18, 2014), which claims the benefit of priority to U.S. Provisional Application No. 61/438,007, filed Jan. 31, 2011, each of which is incorporated herein by reference in its entirety.

TECHNICAL FIELD

The exemplary embodiments described herein generally relates to the field of magnetoelectronic devices, and more particularly to CMOS compatible magnetoelectronic field sensors used to sense magnetic fields.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, generally are Hall effect devices with flux concentrators or anisotropic magnetoresistance (AMR) based devices. In order to arrive at the required sensitivity and reasonable resistances that mesh well with CMOS, the sensing units of AMR sensors are generally on the order of square millimeters in size, while the auxiliary CMOS associated with hall effect sensors can similarly become large and expensive. For mobile applications, such AMR sensor configurations are too costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ, GMR, and AMR sensors have been employed in a Wheatstone bridge structure to increase sensitivity and to eliminate temperature dependent resistance changes. For minimal sensor size and cost, MTJ or GMR elements are preferred. Typically, a Wheatstone bridge structure uses magnetic shields to suppress the response of reference elements within the bridge so that only the sense elements (and hence the bridge) respond in a predetermined manner. However, the magnetic shields are thick and their fabrication requires carefully tuned NiFe seed and plating steps. Another drawback associated with magnetic shields arises when the shield retains a remnant field when exposed to a strong (~5 kOe) magnetic field, since this remnant field can impair the low field measuring capabilities of the bridge structure. To prevent the use of magnetic shields, a Wheatstone bridge structure may include two opposite anti-ferromagnetic pinning directions for each sense axis, resulting in four different pinning directions which must be individually set for each wafer, very often requiring complex and unwieldy magnetization techniques.

Increasing the number of sensor elements in an array provides a desired higher signal to noise ratio. However, the sensor elements must be resettable into a known orientation in the event that they should be scrambled by exposure to an external magnetic field. A reset line may create the resetting magnetic field by providing a reset current pulse of short duration. The resistance of the reset line limits the line run length while allowing pulses of sufficient reset current from a fixed voltage overhead and therefore limits the array size. Increasing the density of the sensor elements within an array through processing or optimal sensor layout improves the signal to noise ratio without any additional complication.

Accordingly, it is desirable to provide a magnetoelectronic sensor fabrication method and layout having a high signal to noise ratio for measuring various physical parameters. There is also a need for a simple, rugged and reliable sensor that can be efficiently and inexpensively constructed as an integrated circuit structure for use in mobile applications. There is also a need for an improved magnetic field sensor and method to overcome the problems in the art, such as outlined above. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A magnetic sensor is configured for enabling independent optimization of the material resistance area (RA) of the MTJ and setting total device resistance so that the total resistance is not so high that Johnson noise becomes a signal limiting concern, and yet not so low that CMOS elements may diminish the read signal. Alternatively, another configuration results in independent optimization of both functions, and more freedom in device design and layout. The X and Y pitch of the sense elements may be arranged such that the line segment that stabilizes, for example, the right side of one sense element; also stabilizes the left side of the adjacent sense element.

In an exemplary embodiment, a method of fabricating a magnetic sensor, comprises forming a plurality of groups, each comprising a plurality of magnetic tunnel junction devices, wherein forming each of the magnetic tunnel junction devices comprises forming a synthetic antiferromagnetic reference layer; forming a tunnel barrier over the synthetic antiferromagnetic reference layer; and forming and patterning a plurality of sense elements over the tunnel barrier wherein the plurality of sense elements utilize a common shaped reference layer; and forming a plurality of conductors over the magnetic tunnel junction devices, wherein the plurality of conductors and the synthetic antiferromagnetic reference layers and are configured to couple one of the magnetic tunnel junction devices within each group in parallel and the groups in series; or the magnetic tunnel junction devices within each of at least two groups in series and the at least two groups in parallel.

In another exemplary embodiment, a magnetic sensor comprises a plurality of groups, each group comprising one or more subgroupings of a plurality of magnetic tunnel junction devices, each subgrouping comprising an electrode and a shaped reference layer over the electrode; a tunnel barrier over the shaped reference layer; and a plurality of sense elements over the tunnel barrier layer wherein a sense element, the portion of the tunnel barrier layer under the sense element, and the portion of the reference element under the sense element form a magnetic tunnel junction device; and a plurality of conductors over the plurality of magnetic tunnel junction devices, wherein the plurality of conductors and one or more of the electrodes are configured to electrically couple one of the magnetic tunnel junction devices within each group in parallel and the groups in series; or the magnetic tunnel junction devices within each of the plurality of groups in series and the plurality of groups in parallel.

In yet another exemplary embodiment, a magnetic sensor comprises a plurality of groups, each group comprising a plurality of magnetic tunnel junction devices, each magnetic tunnel junction device within a group sharing a common synthetic antiferromagnetic reference layer and a common tunnel barrier positioned on the synthetic antiferromagnetic reference layer, and each magnetic tunnel junction device having a unique sense element formed over the tunnel barrier.

BRIEF DESCRIPTION OF THE DRAWINGS

The present invention will hereinafter be described in conjunction with the following drawing figures, wherein like numerals denote like elements.

DETAILED DESCRIPTION

Figure 1:
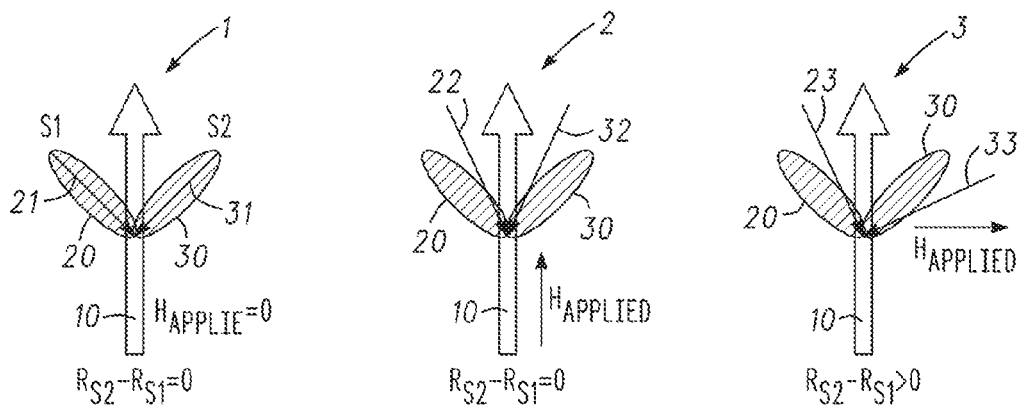
FIG. 1 illustrates two active sense elements having magnetizations that are angled equally in different directions from a pinned layer that will deflect in response to an externally applied magnetic field and provide an output signal related to the component of the magnetic field that is not aligned with the pinning direction of the pinned layer.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A magnetic field sensing device includes, for example at least one Wheatstone bridge, wherein each leg comprises an array of magnetic tunnel junctions (MTJs). Each MTJ includes a reference layer, a tunnel barrier (TB), and a sense layer (or sense element). For the highest signal to noise ratio in a given chip area (the densest packing of sense elements), groups of these MTJs may share a common reference layer. The shape of the reference layer may optionally be configured to set a reference axis in a first reference direction. A plurality of MTJs (group) are connected in parallel via an upper electrode, and a plurality of these groups are connected in series for (1) enabling independent optimization of the material resistance area product (RA) of the MTJ for best performance; and (2) setting total device resistance so that the total bridge resistance is not so high that Johnson noise becomes a signal limiting concern, and yet not so low that CMOS elements may diminish the read signal. At least one current line is disposed near each sensing element. The pitch (distance between or density) of the sense elements is arranged so that the minimal manufacturable sense element spaces are maintained (~0.1 um), and current lines near the sense elements may adjoin, yielding a single stabilization strip that traverses the array. A current source supplies a stabilization current to the at least one current line, and measuring circuitry is coupled to a sensing element output terminal for measuring the output and determining the strength of the magnetic field. An orienting pulse may be applied to the current line preceding each measurement, or at a fixed or algorithmically determined interval.

In another embodiment, after the pinning step which configures the reference layer magnetization in accordance to its shape is complete, the reference layer may be reshaped, removing portions between specified sense elements in the array during the manufacturing method to produce the structure disclosed above. The top electrode is subsequently broken into segments of connecting groups of sense elements in series. These groups may be arranged in series or parallel. In this manner, the electrical connection path and the magnetic reference direction of the reference layer may be individually configured, leading to independent optimization of both functions, and more freedom in device design and layout. A larger span of input material resistances may be accommodated to produce a more precisely controlled final desired device resistance. Additionally, the effect of an individual low resistance element on the total bridge output may be diminished dramatically in comparison to its effect as a member of a parallel wired group as it would short out that parallel segment. If the array is connected as outlined above, a single low resistance element merely reduces the group resistance in approximate proportion to the total number of array members. Finally, arranging in this series first wiring option reduces the impact of the outer interconnects connecting the groups together on the sensor parameters significantly.

In yet another embodiment, multiple stabilization lines pass proximal to each sensing element, stabilizing different portions (i.e. left and right sides—but not necessarily limited to two passes of the stabilization line) of each sense element. The X and Y pitch of the sense elements are arranged such that the line segment that stabilizes, for example, the right side of one sense element; also stabilizes the left side of the adjacent sense element. This configuration allows further flexibility in the arrangement of sense elements within a sensor bridge so that the relative orientations between sense and reference layer anisotropy axes may be maintained while maximizing the packing densities of the sense elements. This allows a larger number of sense elements to be stabilized with a fixed line length or conversely a fixed maximal stabilization line resistance, and at a significantly higher packing density such that the number of sense elements may be increased while the footprint of the sensor may be reduced.

The sense array is optimally sized for highest possible signal-to-noise (SNR) while allowing the available voltage supply to stabilize the sensors with the required current during the measurement phase. Two or more copper lines (or parallel connected series of line segments) are routed adjacent each sense element to maintain the relative orientations between sense and reference layer anisotropy axes while maximizing the packing densities of the sense elements, thereby allowing for a larger number of sense elements to be stabilized with a fixed line length or a fixed maximal stabilization line resistance. The continuous stabilization line that is formed from the abutting of adjacent cells stabilizes one section of a sense element in the first pass proximal to the sense element, and then different sections of the adjacent sense element. Therefore, each stabilization line segment within a given unit cell is used to stabilize more than one sense element, and a substantially increased packing density results.

The exemplary embodiments described herein may be fabricated using known lithographic processes as follows. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photo resist material is applied onto a layer overlying a wafer substrate. A photo mask (containing clear and opaque areas) is used to selectively expose this photo resist material by a form of radiation, such as ultraviolet light, electrons, or x-rays. Either the photo resist material exposed to the radiation, or that not exposed to the radiation, is removed by the application of a developer. An etch may then be applied to the layer not protected by the remaining resist, and when the resist is removed, the layer overlying the substrate is patterned. Alternatively, an additive process could also be used, e.g., building a structure using the photo resist as a template.

It will be appreciated that additional processing steps will be used to fabricate MTJ sensor structures. As examples, one or more dielectric, ferromagnetic and/or conductive layers may be deposited, patterned and etched using well known techniques, along with conventional backend processing (not depicted), typically including formation of multiple levels of interconnect that are used to connect the sensor structures in a desired manner to achieve the desired functionality. Thus, the specific sequence of steps used to complete the fabrication of the sensor structures may vary, depending on the process and/or design requirements.

The disclosed fabrication process may be used to form a magnetic field sensor from two differential sensor configurations for a single axis response, with only a single pinned direction. For two axis (X, Y) magnetic field response, the sensor only requires two distinct pinning axes, where each differential sensor is formed from a bridge structures with unshielded magnetic tunnel junction (MTJ) sensors. For a third axis (Z), no additional pinning direction is required. The distinct pinning axes may be obtained using shape anisotropy of differently shaped pinning layers in combination with a carefully selected anneal process, or by forming two distinct pinning layers which are separately set and annealed. In a given differential sensor formed from MTJ sensors connected in a bridge circuit, shape anisotropy may be used to create sense elements having different magnetizations at zero field that are angled at different orientations from the magnetization of the pinned layer, for example, at negative 45 degrees and positive 45 degrees. In this configuration, an applied field that includes a component that is orthogonal to the pinning direction will change the magnetization of the different sense layers differently, and as a result, the differential sensor is able to measure the projection of the applied field perpendicular to the pinned axis. The disclosed fabrication process also forms a field conductor below and optionally above each MTJ sensor that may be used to apply a field pulse along the easy axis of the sense layers to prepare the sensor for measurement, and a smaller current to stabilize the sensor during measurement if desired.

Turning now to FIG. 1, a sensor structure 1 is shown in simplified schematic form which uses two active sense element types 20, 30 and a pinned layer 10 to measure an external magnetic field. As depicted, the magnetization directions 21, 31 of the active sense elements 20, 30 are angled equally and in different directions from the magnetization direction of a pinned layer 10. To this end, the sense elements 20, 30 may be formed so that the shape of each sense element is elongated in the direction of the desired magnetization for that sense element. Thus sense elements 20, 30 use their shape anisotropy to create magnetization directions that are offset from the pinned layer 10. For example, the first sense element 20 may be formed so that its preferred magnetization direction is angled at −135 degrees from the magnetization direction of the pinned layer 10, and with the second sense element 30 so that its preferred magnetization direction is angled at 135 degrees from the magnetization direction of the pinned layer 10, although other offset angles may be used.

Because the conductance across a sense element and pinned layer depends on the cosine of the angle between the sense element and the pinned layer, the conductance of the sensor structure can be changed by applying an external magnetic field (H) which deflects the magnetization of the sensor elements 20, 30. For example, if there is no applied field (H=0) to a sensor structure 1, then the magnetization directions 21, 31 of the sense elements 20, 30 are unchanged, and there is no difference between the conductance of the first and second sensor elements 20, 30. And if an external field H is applied to a sensor structure 2 that is directed along or anti-parallel to the pinned layer 10, the applied field will deflect or rotate the magnetic moments 22, 32 of the sensor elements 20, 30 equally, resulting in equal conductance changes for each sense element, and hence no change in their difference. However, when an external field H is applied to a sensor structure 3 that is orthogonal to the pinned layer 10, the magnetic moments 23, 33 for each sense element 20, 30 are changed differently in response to the applied field. For example, when the external field H shown in FIG. 1 is directed to the right, the/conductance of the first sense element 20 is increased, while the conductance of the second sense element 30 is reduced, resulting in a difference signal that is related to the field strength. In this way, the depicted sensor structure measures the projection of the applied field perpendicular to the pinned axis, but not parallel to it. For low angle magnetization deflections (low field when compared with the anisotropy of the sense elements), a Taylor expansion of the resistance, neglecting high order terms, is valid and the resistances will also vary in a linear with the conductance. For high angle deflections (higher field strength detection) it is beneficial to utilize a voltage driven, but current detecting half bridge device topology to maintain a more linear response.

Figure 2:
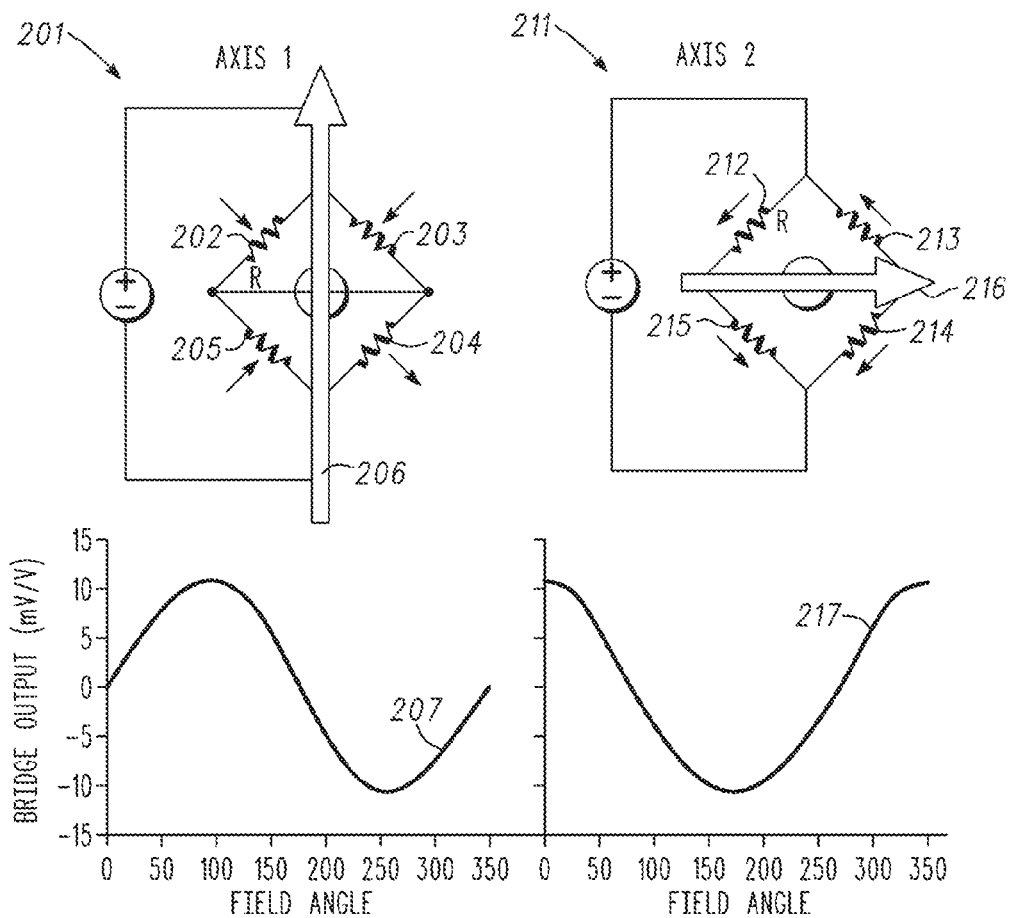
FIG. 2 illustrates an electronic compass structure which uses differential sensors formed from two bridge structures with unshielded MTJ sensors, along with the circuit output for each bridge structure.

FIG. 2 shows first and second sensors 201, 211 for detecting the component directions of an applied field along a first x-axis (Axis 1) and a second y-axis (Axis 2), respectively. As depicted, each sensor is formed with unshielded sense elements that are connected in a bridge configuration. Thus, the first sensor 201 is formed from the connection of sense elements 202-205 in a bridge configuration over a pinned layer 206 that is magnetized in a first direction. In similar fashion, the second sensor 211 is formed from the connection of sense elements 212-215 in a bridge configuration over a pinned layer 216 that is magnetized in a second direction that is perpendicular to the magnetization direction of the pinned layer 206. In the depicted bridge configuration 201, the sense elements 202, 204 are formed to have a first magnetization direction and the sense elements 203, 205 are formed to have a second magnetization direction, where the first and second magnetization directions are orthogonal with respect to one another and are oriented to differ equally from the magnetization direction of the pinned layer 206. As for the second bridge configuration 211, the sense elements 212, 214 have a first magnetization direction that is orthogonal to the second magnetization direction for the sense elements 213, 215 so that the first and second magnetization directions are oriented to differ equally from the magnetization direction of the pinned layer 216. In the depicted sensors 201, 211, there is no shielding required for the sense elements, nor are any special reference elements required. In an example embodiment, this is achieved by referencing each active sense element (e.g., 202, 204) with another active sense element (e.g., 203, 205) using shape anisotropy techniques to establish the easy magnetic axes of the referenced sense elements to be deflected from each other by 90 degrees.

By positioning the first and second sensors 201, 211 to be orthogonally aligned with the orthogonal sense element orientations in each sensor being deflected equally from the sensor's pinning direction, the sensors can detect the component directions of an applied field along the first and second axes. This is illustrated in FIG. 2 with the depicted circuit simulation shown below each sensor. In each simulation, the simulated bridge output 207, 217 is a function of an applied field angle for sense elements with an anisotropy field of 10 Oe, applied field of 0.5 Oe, and a magnetoresistance of 100% when the sense element switches from an anti-parallel state to a parallel state. The simulated bridge outputs can be used to uniquely identify any orientation of the applied external field. For example, a field that is applied with a 0 degree field angle (e.g., pointing "up" so that it is aligned with the y-axis or Axis 2) will generate a bridge output of 0 mV/V from the first sensor 201, and will generate a bridge output of 10 mV/V from the second sensor 211. Conversely, a field that is applied in the opposite direction (e.g., pointing "down" so that it is aligned with a 180 degree field angle) will generate a bridge output of 0 mV/V from the first sensor 201, and will generate a bridge output of −10 mV/V from the second sensor 211.

As seen from the foregoing, a magnetic field sensor may be formed from differential sensors 201, 211 which use unshielded sense elements 202-205, 212-215 connected in a bridge configuration over respective pinned layers 206, 216 to detect the presence and direction of an applied magnetic field. With this configuration, the possibility of residual magnetic moment present in magnetic shielding or NiFe flux concentrator, such as present in three dimensional hall devices is eliminated. In addition, the magnetic field sensor provides good sensitivity, and also provides the temperature compensating properties of a bridge configuration. By eliminating the need to form magnetic shielding layers, the manufacturing complexity and cost is reduced and the size of the sensor structure is decreased (in terms of eliminating the silicon real estate required to form any shielding layers). There are also performance benefits to using unshielded sense elements since the magnetic remnance problem is eliminated by removing the magnetic shielding and flux guiding layers.

Figure 3:
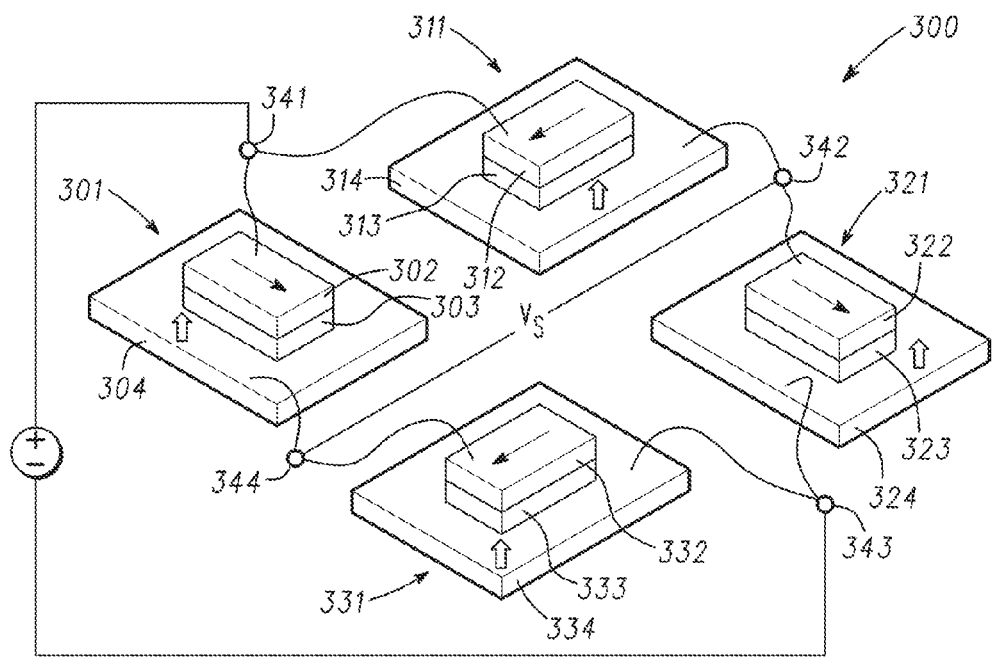
FIG. 3 is a simplified schematic perspective view of a Wheatstone bridge circuit in which series-connected MTJ sensors are aligned to have different magnetization directions from the magnetization direction of the pinned layer.

FIG. 3 provides a simplified schematic perspective view of an example field sensor 300 formed by connecting four MTJ sensors 301, 311, 321, 331 in a Wheatstone bridge circuit, where the series-connected MTJ sensors 301, 311, 321, 331 are formed with sense layers 302, 312, 322, 332 that are aligned to have different magnetization directions from the magnetization direction of the pinned layers 304, 314, 324, 334. The depicted sensor 300 is formed with MTJ sensors 301, 311, 321, 331 that may be manufactured as part of an existing MRAM manufacturing process with only minor adjustments to control the orientation of the magnetic field directions for different layers. In particular, each MTJ sensor 301, 311, 321, 331 includes a first pinned electrode 304, 314, 324, 334, an insulating tunneling dielectric layer 303, 313, 323, 333, and a second sense electrode 302, 312, 322, 332. The pinned and sense electrodes are desirably magnetic materials, for example, and not intended to be limiting, NiFe, CoFe, Fe, CoFeB and the like, or more generally, materials whose magnetization can be collectively aligned. Examples of suitable electrode materials and arrangements are the materials and structures commonly used for electrodes of magnetoresistive random access memory (MRAM) devices, which are well known in the art and contain, among other things, ferromagnetic materials. The pinned and sense electrodes may be formed to have different coercive force or field requirements. The coercive field is basically the amount of field that is required to reverse the magnet from one direction to another after saturation. Technically, it is the magnetic field required to return the magnetization of the ferromagnet to zero after it has been saturated. For example, the pinned electrodes 304, 314, 324, 334 may be formed with an anti-ferromagnetic film exchange coupled to a ferromagnetic film to with a high coercive field so that their magnetization orientation can be pinned so as to be substantially unaffected by movement of an externally applied magnetic field. In contrast, the sense electrodes 302, 312, 322, 332 may be formed with a magnetically soft material to provide different anisotropy axes having a comparatively low coercive force so that the magnetization orientation of the sense electrode (in whatever direction it is aligned) may be altered by movement of an externally applied magnetic field. In selected embodiments, the coercive field for the pinned electrodes is about two orders of magnitude larger than that of sense electrodes, although different ratios may be used by adjusting the respective coercive fields of the electrodes using well known techniques to vary their composition and/or pinning strength.

As shown in FIG. 3, the pinned electrodes 304, 314, 324, 334 in the MTJ sensors are formed to have a first exemplary anisotropy axis alignment in the plane of the pinned electrode layers 304, 314, 324, 334 (identified by the vector arrows pointing toward the top of the drawing of FIG. 3). As described herein, the anisotropy axis alignment for the pinned electrodes 304, 314, 324, 334 may be obtained using shape anisotropy of the pinned electrodes, in which case the shapes of the pinned electrodes 304, 314, 324, 334 would each be longer in the direction of the "up" vector arrow for a single layer pinned magnetic stack. In addition or in the alternative, the anisotropy axis alignment for the pinned electrodes 304, 314, 324, 334 may be obtained by forming one or more magnetic layers in the presence of a saturating magnetic field that is subsequently or concurrently annealed and then cooled so that the magnetic field direction of the pinned electrode layers is set in the direction of the saturating magnetic field. As will be appreciated, the formation of the anisotropy axis alignment for the pinned electrodes 304, 314, 324, 334 must be reconciled with the fabrication steps used to form any other field sensors which include pinned electrodes having a distinct anisotropy axis alignment, as well as any fabrication steps used to form any sense electrodes having a distinct anisotropy axis alignment.

The depicted field sensor 300 also includes MTJ sensors 301, 321 in which sense electrodes 302, 322 are formed to have an exemplary anisotropy axis (identified by the left-pointing vector arrows) that is offset from the anisotropy axis of the pinned electrodes by a first deflection angle. In addition, the depicted field sensor 300 includes MTJ sensors 311, 331 in which sense electrodes 312, 332 are formed to have an exemplary anisotropy axis (identified by the right-pointing vector arrows) that is offset from the anisotropy axis of the pinned electrodes by a second deflection angle which is equal but opposite to the first deflection angle. In a particular embodiment, the first deflection angle is perpendicular to the second deflection angle so that anisotropy axis of the sense electrodes 302, 322 is rotated 135 degrees with respect to the anisotropy axis of the pinned electrodes, and so that anisotropy axis of the sense electrodes 312, 332 is rotated negative 135 degrees with respect to the anisotropy axis of the pinned electrodes.

As will be appreciated, the MTJ sensors 301, 311, 321, 331 may be formed to have identical structures that are connected as shown in series by metal interconnections in a standard Wheatstone bridge circuit configuration with both power supply terminals 341, 343 and output signal terminals 342, 344 for the bridge circuit being shown. By connecting in series the unshielded MTJ sensors 301, 311, 321, 331 in a Wheatstone bridge circuit, the field sensor 300 detects the horizontal direction (left to right in FIG. 3) component of an externally applied magnetic field, thereby forming an X-axis sensor bridge. In particular, a horizontal field component would deflect the magnetization of the sense electrodes 302, 322 differently from the deflection of the magnetization of the sense electrodes 312, 332, and the resulting difference in sensor conductance/resistance would quantify the strength of the horizontal field component. Though not shown, a Y-axis sensor bridge circuit may also be formed with unshielded MTJ sensors connected in a Wheatstone bridge circuit configuration, though the anisotropy axis of the pinned electrodes in the Y-axis sensor bridge circuit would be perpendicular to the anisotropy axis of the pinned electrodes 304, 314, 324, 334 in the X-axis sensor bridge. Each of these sensors (or bridge legs) 301, 311, 321, 331 may represent an array of sense elements working in concert to increase the overall SNR of the system.

Low field magnetic sensors are susceptible to Barkhausen noise, sporadic de-pinning, jumps of micro-magnetic domains resulting from different regions in the magnetic sense element that may have slightly different orientations of their local magnetic moment from weak localized magnetization pinning caused by edge roughness, or small local inhomogeneities in the sense layer, or a myriad of other sources. Such noise can introduce errors in accurately measuring the angular resolution of the Earth's magnetic field. When a field is applied, these micro-magnetic domains may reverse in a sequential fashion in lieu of the desired coherent rotation of the sense element. Prior attempts to address such noise have used a hard magnetic bias layer in the sense layers to pin the ends of the device. However, hard bias layers can reduce the sensitivity of the sensor, and have the additional disadvantages of requiring an additional processing layer, etch step and anneal step.

To address the Barkhausen noise problem, a magnetic field may be selectively applied along the easy axis of the sense element prior to performing a measurement. In selected embodiments, the magnetic field is applied as a brief field pulse that is sufficient to restore the magnetic state of the sense element and remove micro-magnetic domains that may have appeared as the result of exposure to a strong field. In an example implementation, a field pulse is applied to a sensor to remove metastable pinned regions in the sense element, where the field pulse has a threshold field strength (e.g., above approximately 40 Oe) and a minimum pulse duration (e.g., of approximately 2-100 nanoseconds). By applying such a field pulse with a predetermined measurement period (e.g., 10 Hz) as required for a compass application, the resulting field pulse has an extremely low duty cycle and minimal power consumption. In addition, by terminating the field pulse prior to measurement, there is no additional field applied to the sense element during measurement, resulting in maximal sensitivity. Alternatively, a much lower stabilizing field may be applied through the same reset line during sensor measurement, minimally impacting the sensitivity, but encouraging clean coherent rotation of the sense element magnetization.

Figure 4:
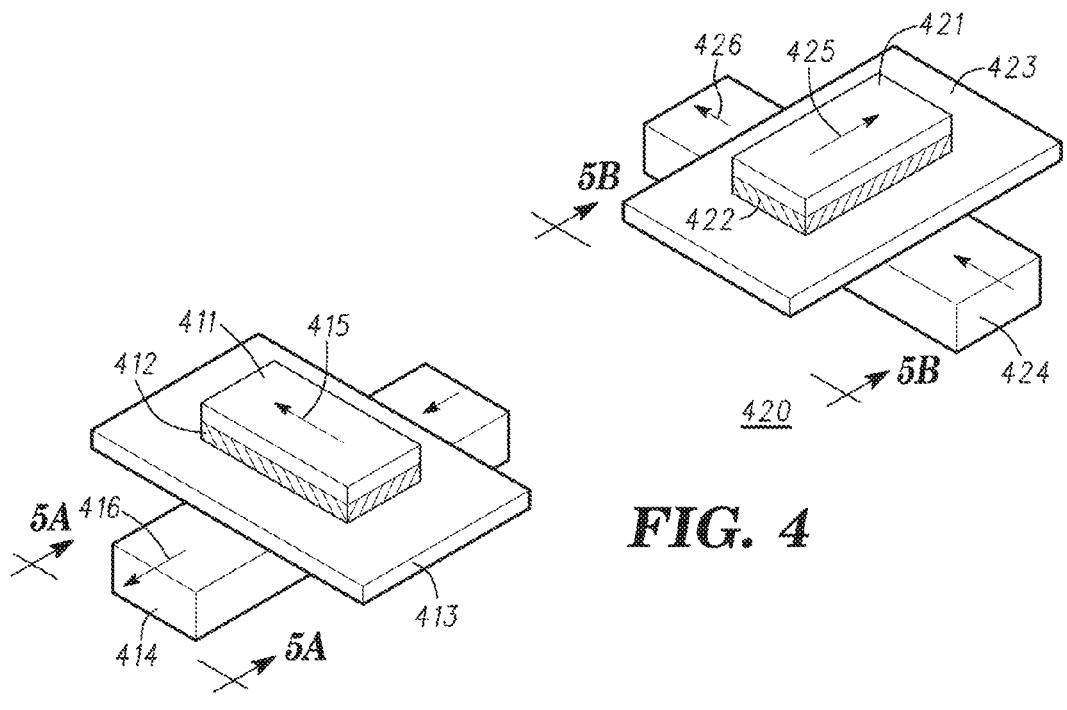
FIG. 4 is a partial schematic perspective view of first and second MTJ sensors which include a magnetic field generator structure for clearing or stabilizing the sense layer prior to or during sense operations.

To illustrate an example of how a field pulse may be applied to a sense element, reference is now made to FIG. 4, which shows a partial schematic perspective view of first and second MTJ sensors 410, 420 which each include a magnetic field generator structure 414, 424 for resetting or stabilizing the sense layer 411, 421 prior to or during sense operations. Each MTJ sensor may be constructed as shown in FIG. 4 where the magnetic direction of the sense layer determines the orientation of the magnetic field generator structure. In particular, each MTJ sensor generally includes an upper ferromagnetic layer 411, 421, a lower ferromagnetic layer 413, 423, and a tunnel barrier layer 412, 422 between the two ferromagnetic layers. In this example, the upper ferromagnetic layer 411, 421 may be formed to a thickness in the range 10 to 10000 Angstroms, and in selected embodiments in the range 10 to 100 Angstroms, and functions as a sense layer or free magnetic layer because the direction of its magnetization can be deflected by the presence of an external applied field, such as the Earth's magnetic field. As for the lower ferromagnetic layer 413, 423, it may be formed to a thickness in the range 10 to 2000 Angstroms, and in selected embodiments in the range 10 to 100 Angstroms, and functions as a fixed or pinned magnetic layer when the direction of its magnetization is pinned in one direction that does not change magnetic orientation direction during normal operating conditions. As described above, the first and second MTJ sensors 410, 420 may be used to construct a differential sensor by forming the lower pinned layers 413, 423 to have the same magnetization direction (not shown), and by forming the magnetization direction 415 in upper sense layer 411 to be orthogonal to the magnetization direction 425 in upper sense layer 421 so that the magnetization directions 415, 425 are oriented in equal and opposite directions from the magnetization direction of the lower pinned layers 413, 423.

To restore the original magnetization of the upper sense layers 411, 421 that can be distorted by magnetic domain structure, FIG. 4 depicts a magnetic field generator structure 414, 424 formed below each sensor. In selected embodiments, the magnetic field generator structure 414, 424 is formed as a conducting current line which is oriented to create a magnetic field pulse which aligns with the magnetization direction 415, 425 in the upper sense layer 411, 421. For example, when a current pulse flows through the magnetic field generator structure 414 below the first MTJ sensor 410 in the direction indicated by the arrow 416, a field pulse is created that is aligned with the easy axis 415 of the sense element 411 in the first MTJ sensor 410. However, since the second MTJ sensor 420 has a sense layer 421 with a different magnetization direction 425, the magnetic field generator structure 424 is oriented so that a field pulse is created that is aligned with the easy axis 425 of the sense element 421 in the second MTJ sensor 420 when a current pulse flows through the magnetic field generator structure 424 in the direction indicated by the arrow 426.

Figure 5:
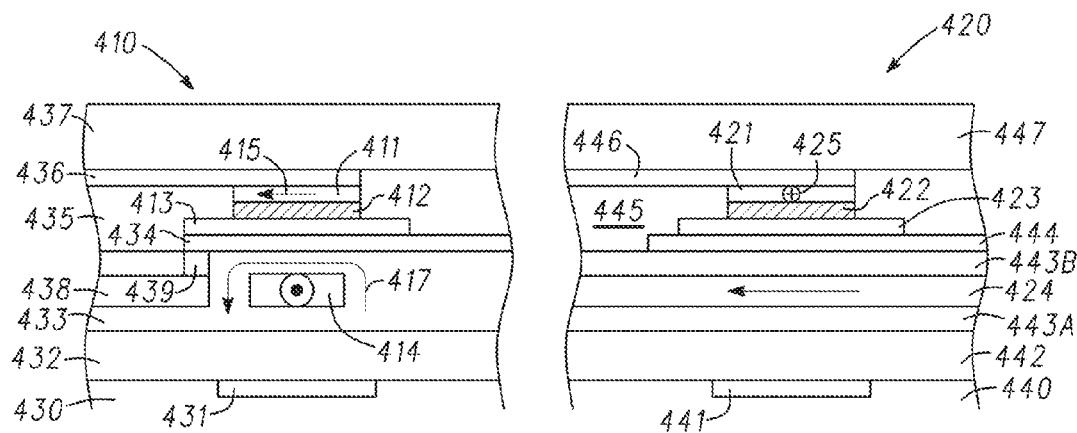
FIG. 5 is a partial cross-sectional view of an integrated circuit in which the first and second MTJ sensors shown in FIG. 4 are formed to have sense layers with different magnetization directions.

The relative alignment of the field pulse and easy axis directions may also be seen in FIG. 5, which depicts a partial cross-sectional view of an integrated circuit device in which the first and second MTJ sensors shown in FIG. 4 are formed to have sense layers 411, 421 with different magnetization directions. In particular, the cross-sectional view on the left shows the first MTJ sensor 410 as seen from the perspective view 5A in FIG. 4, while the cross-sectional view on the right shows the second MTJ sensor 420 as seen from the perspective view 5B in FIG. 4. The first and second MTJ sensors 410, 420 are each formed over a substrate 430, 440 which may have an active circuit 431, 441 embedded therein. On the substrate, one or more circuit layers 432, 442 may be formed before forming an insulating layer 433, 443 in which a conductive line 414, 424 is embedded to form a magnetic field generator structure. As shown in FIG. 5, the conductive line 414 in the first MTJ sensor 410 is formed to carry current in the direction coming out of plane of the drawing of FIG. 5, while the conductive line 424 in the second MTJ sensor 420 is formed to carry current moving right-to-left on the drawing. Over the embedded conductive lines, the first and second MTJ cores are formed in an insulating layer 435, 445. In particular, the first MTJ core in the first MTJ sensor 410 includes a first conductive line 434 at least partially embedded in the insulating layer 435, a lower pinned ferromagnetic layer 413, a tunnel barrier layer 412, an upper sense ferromagnetic layer 411 having a magnetization direction 415 that is oriented right-to-left, and a second conductive line 436 over which is formed an additional dielectric layer 437. The first conductive layer 434 is connected to a bottom contact layer 438 through a via structure 439. In addition, the second MTJ core in the second MTJ sensor 420 includes a first conductive line 444 at least partially embedded in the insulating layer 445, a lower pinned ferromagnetic layer 423, a tunnel barrier layer 422, an upper sense ferromagnetic layer 421 having a magnetization direction 425 that is oriented into the plane of the drawing of FIG. 5, and a second conductive line 446 over which is formed an additional dielectric layer 447. To connect the first and second MTJ sensors 410, 420, the first conductive layer 444 in the second MTJ sensor 420 is connected through a via structure (not shown) to a bottom contact layer (not shown) in the same level as the embedded conductive line 424, which in turn is connected through one or more vias and conductive layers to the second conductive line 436 from the first MTJ sensor 410. With the depicted configuration, current pulses through the embedded conductive line 414 will create a magnetic field pulse 417 which is aligned with the easy axis 415 of the sense element 411, and current pulses through the embedded conductive line 424 will create a magnetic field pulse in the region of the sense element 421 (not shown) which is aligned with the easy axis 425 of the sense element 421.

The lower pinning and pinned ferromagnetic layers 413, 423 may be a material, for example, iridium manganese, platinum manganese, cobalt iron, cobalt iron boron, nickel iron, ruthenium, and the like, or any combination thereof. The tunnel barrier layers 412, 422 may be an insulating material, for example, aluminum oxide or magnesium oxide. The upper sense ferromagnetic layers 411, 421 may be a ferromagnetic material, for example, nickel iron, cobalt iron, cobalt iron boron, ruthenium, and/or the like. The magnetic field generator structures 414, 424 may be aluminum, copper, tantalum, tantalum nitride, titanium, titanium nitride or the like, while conductive lines in general may be, for example, aluminum, copper, tantalum, tantalum nitride, titanium, titanium nitride or the like.

The first and second MTJ sensors 410, 420 may be fabricated together on a monolithic integrated circuit as part of a differential sensor by forming sense layers 411, 421 having orthogonal magnetic orientations that each differ equally from the magnetic direction of the pinned layers 413, 423. In an example process flow, the first step in the fabrication process is to provide a monolithic integrated circuit chip substrate which is covered by a dielectric base layer (not shown). Over the dielectric base layer, magnetic field generator structures 414, 424 are formed as embedded lines of conductive material using known deposition, patterning and etching processes so that the magnetic field generator structures 414, 424 are aligned and positioned below the sensors 410, 420 and embedded in an insulating layer (not shown). Upon the insulating layer, a stack of sensor layers is sequentially formed by depositing a first conductive layer (to serve after etching as the conductive line 434), one or more lower ferromagnetic layers (to serve after etching as the lower pinned ferromagnetic layer 413), one or more dielectric layers (to serve after etching as the tunnel barrier layer 412), one or more upper ferromagnetic layers (to serve after etching as the upper sense ferromagnetic layer 411), and a second conductive layer (to serve after etching as the conductive line 436).

While the various ferromagnetic layers may each be deposited and heated in the presence of a magnetic field to induce a desired magnetic orientation, shape anisotropy techniques may also be used to achieve the required magnetic orientations for the different ferromagnetic layers. To this end, the sensor layer stack is selectively etched with a sequence of patterned etch processes to define the pinned and sense layers in the MTJ sensors 410, 420. In a first etch sequence, the shapes of the different pinning layers 413, 423 are defined from the lower ferromagnetic layer(s) by using patterned photoresist to form a first patterned hard mask and then performing a selective etch process (e.g., reactive ion etching) to remove all unmasked layers down to and including the unmasked lower ferromagnetic layer(s). The resulting shapes of the etched lower ferromagnetic layers are oriented so that each pinned layer has shape anisotropy, resulting in a preferred magnetic orientation along one of its axes. In addition to being formed as long and narrow shapes, additional shaping of the ends of pinned layers may be provided so that each of the pinned layers performs more like a single magnetic domain. Using shape anisotropy, the shaped pinned layers 413, 423 may be annealed to set their respective pinning directions.

At this point in the fabrication process, the upper ferromagnetic layer(s) will have been selectively etched to leave a remnant portion under the first patterned hard mask so that the upper and lower ferromagnetic layer(s) have the same shape. However, the final shape of the sense layers will be smaller than the underlying pinned layers, and to this end, a second etch sequence is used to define the final shapes of the different sense layers 411, 421 from the remnant portions of the upper ferromagnetic layer(s). In the second etch sequence, another photoresist pattern is used to form a patterned hard mask over the parts of the remnant upper ferromagnetic layer(s) layer that will form the sense layers. The pattern is selected to define high aspect ratio shapes for the sense layers when a selective etch process (e.g., reactive ion etching) is used to remove all unmasked layers down to and including the unmasked upper ferromagnetic layer(s) 411, 421. In selected embodiments, the selective etch process may leave intact the underlying shaped pinned layers 413, 423, though in other embodiments, the selective etch process also etches the unmasked portions of the underlying shaped pinned layers 413, 423. The defined high aspect ratio shapes for the sense layers are oriented so that the sense layers 411 are longer in the dimension of the desired magnetization 415 than they are wide, while the sense layers 421 are longer in the dimension of the desired magnetization 425 than they are wide. In other words, the long axis for each sense layer is drawn along the desired magnetization direction for a single ferromagnetic sense layer. In addition to being formed as long and narrow shapes, additional shaping of the ends of sense layers 411, 421 may be provided so that each of the sense layers performs more like a single magnetic domain. For example, the sense layers may be shaped to have pointed ends that taper in the corresponding directions of desired easy axis for the sense layers. Once the shaped sense layers are formed, the desired easy axis magnetic orientations may be induced from their shape anisotropy by briefly annealing the wafer (e.g., at an anneal temperature of approximately 250 degrees C. in the absence of a magnetic field to remove material dispersions. Upon cooling, the magnetizations of the sense layers 411, 421 align with the individual pattern, providing multiple orientations of sense layers.

In a practical deployment, the magnetic field generator structures 414, 424 are formed from the same layer that is necessary to interconnect the bridge legs, and hence creates no additional processing steps. In addition, each of the magnetic field generator structures 414, 424 may be constructed from a single conductive element that is positioned to pass beneath each MTJ sensor with the appropriate orientation, thereby creating field pulses throughout the chip with a single current pulse. While in a practical deployment, each bridge leg will comprise arrays of sense elements for highest Signal to Noise Ratio (SNR), a simplified example a single sense element implementation is illustrated with FIG. 6 which provides a simplified schematic top or plan view of a reticle layout showing differential sensor 600 formed with a plurality of series-connected MTJ sensors 621, 622, 623, 624 configured in a Wheatstone bridge circuit with a magnetic field generator structure 620 positioned in relation to the MTJ sensors. The depicted differential sensor includes four pinned layers 601, 602, 603, 604 which each have the same magnetization direction (e.g., a pinned axis in the y-direction), as shown by the large vector arrow on each pinned layer. While the pinned layers 601, 602, 603, 604 may be formed using their shape anisotropy (as indicated in FIG. 6), they may also be formed using a traditional field-anneal process.

Figure 6:
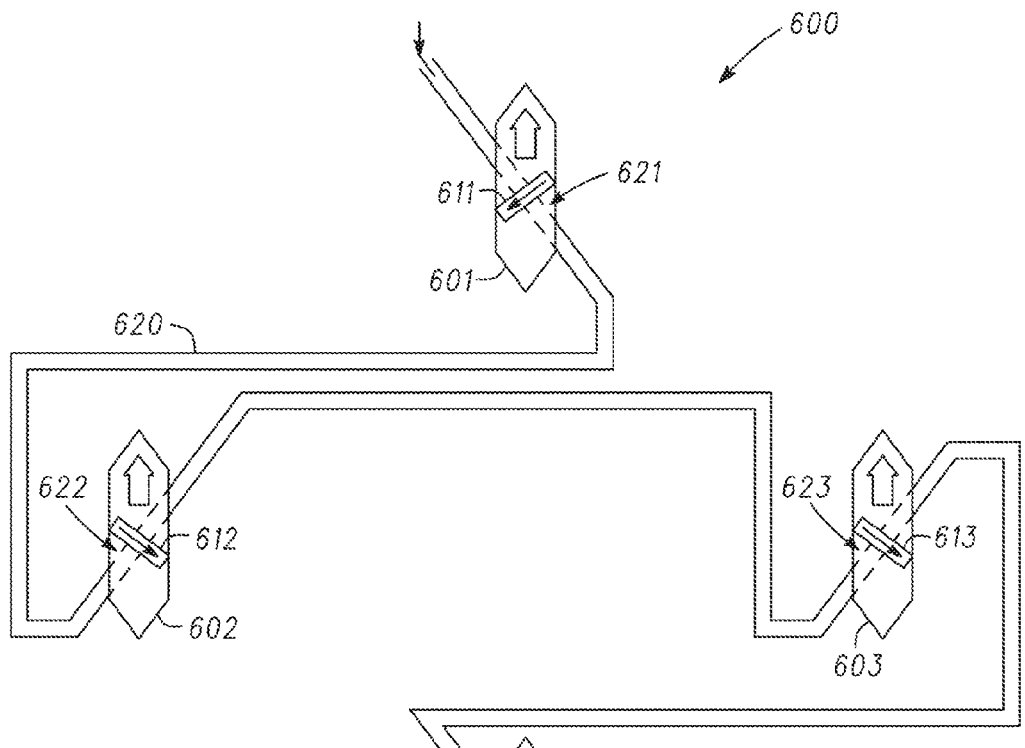
FIG. 6 is a simplified schematic top or plan view of a reticle layout showing differential sensor formed with a plurality of series-connected MTJ sensors configured in a Wheatstone bridge circuit with a magnetic field generator structure positioned in relation to the MTJ sensors.

FIG. 6 also shows that two of the MTJ sensors or sensor arrays, 621, 624 in the differential sensor are formed with sense layers 611, 614 having a magnetization direction that is oriented at negative 135 degrees from vertical, as shown in the sense layers 611, 614. The other two MTJ sensors 602, 603 are formed with sense layers 612, 613 having a magnetization direction that is oriented at 135 degrees from vertical, as shown in the sense layers 612, 613. While any desired technique may be used to form the sense layers having different magnetization directions, selected embodiments of the present invention use shape anisotropy techniques to shape the sense elements 611, 614 to have a magnetization direction (or easy axis) that is oriented at predetermined deflection angle from vertical, and to shape the sense elements 612, 613 to have a magnetization direction (or easy axis) that is oriented negatively at the predetermined deflection angle from vertical. In this way, the magnetization direction of the sense elements 611, 614 and the magnetization direction of the sense elements 612, 613 are offset equally in opposite directions from the magnetization direction of the pinned layers 601, 602, 603, 604.

The depicted differential sensor 600 also includes a magnetic field generator structure 620 which is formed beneath the MTJ sensors 621, 622, 623, 624 so as to selectively generate a magnetic field to stabilize or restore the magnetic field of the sense layers 611, 612, 613, 614. In selected embodiments, the magnetic field generator structure 620 is formed as a single conductive line which is arranged to carry current beneath the sense layers 611, 612, 613, 614 in a direction that is perpendicular to the easy axis orientation of the sense layers so that the magnetic field created by the current is aligned with the easy axis. Thus, the conductive line 620 is formed below the fourth MTJ sensor 624 to create a magnetic field that is aligned with the easy axis of the sense element 614. In addition, the orientation of the conductive line 620 below the second and third MTJ sensors 622, 623 creates a magnetic field that is aligned with the easy axis of the sense elements 612, 613. Finally, the conductive line 620 is formed below the first MTJ sensor 621 to create a magnetic field that is aligned with the easy axis of the sense element 611.

An exemplary fabrication design and layout for forming the above described sensors 410, 420 (FIG. 4) and the magnetic field generator structures 414, 424, 620 in three array embodiments is described in FIGS. 7-21. A substrate (not shown), in which the structures described below are integrated, may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate may be implemented as the top semiconductor layer of a semiconductor-on-insulator (SOI) structure. Though not shown, one or more circuit elements may be formed on or in the substrate. In addition, a base insulator layer (not shown) is formed by depositing or growing a dielectric (e.g., silicon dioxide, oxynitride, metal-oxide, nitride, etc.) over the semiconductor substrate using chemical vapor deposition (CVD), plasma-enhanced chemical vapor deposition (PECVD), physical vapor deposition (PVD), atomic layer deposition (ALD), ion beam deposition (IBD), thermal oxidation, or combinations of the above.

Figure 7:
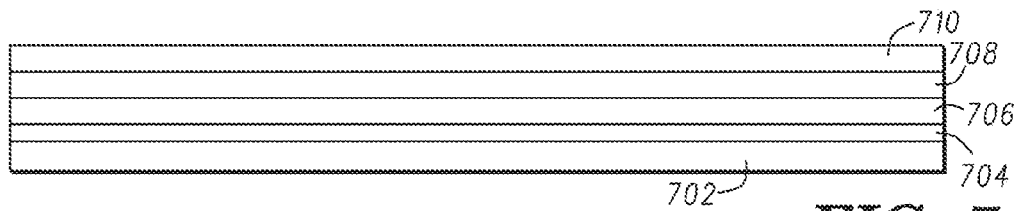
FIGS. 7 and 8 are a partial cross section and a top view, respectively, of a first series of steps in the process of forming a first exemplary embodiment.
Figure 8:
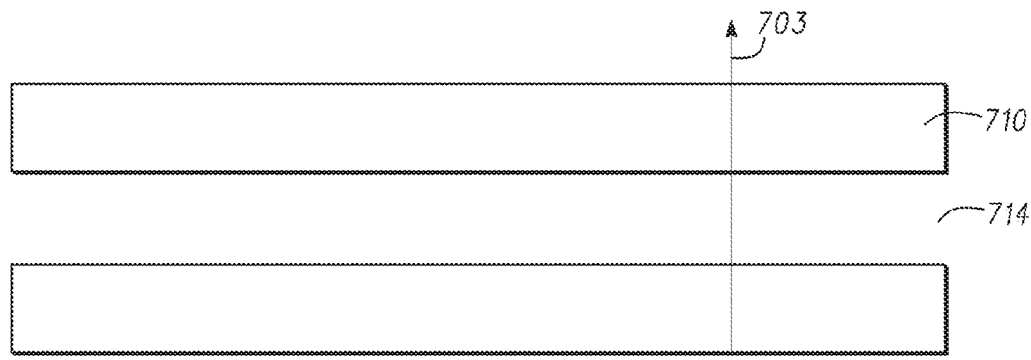
Figure 9:
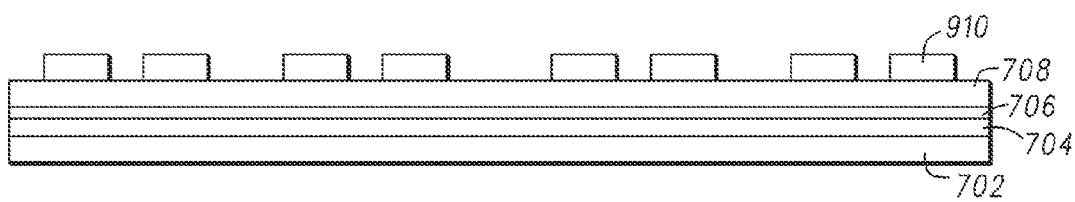
FIGS. 9 and 10 are a partial cross section and a top view, respectively, of a second series of steps in the process of forming a first exemplary embodiment'
Figure 10:
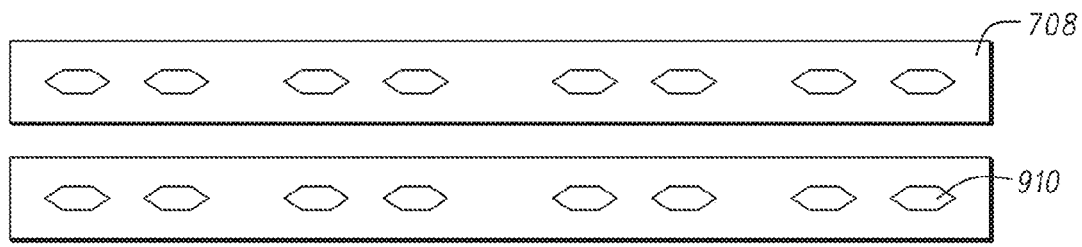
Figure 11:
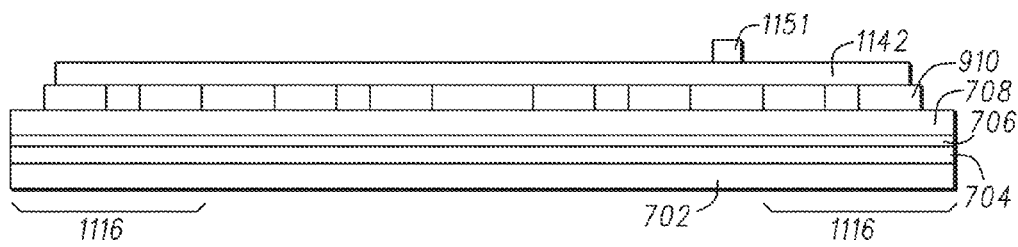
FIGS. 11 and 12 are a partial cross section and a top view, respectively, of a third series of steps in the process of forming a first exemplary embodiment.
Figure 12:
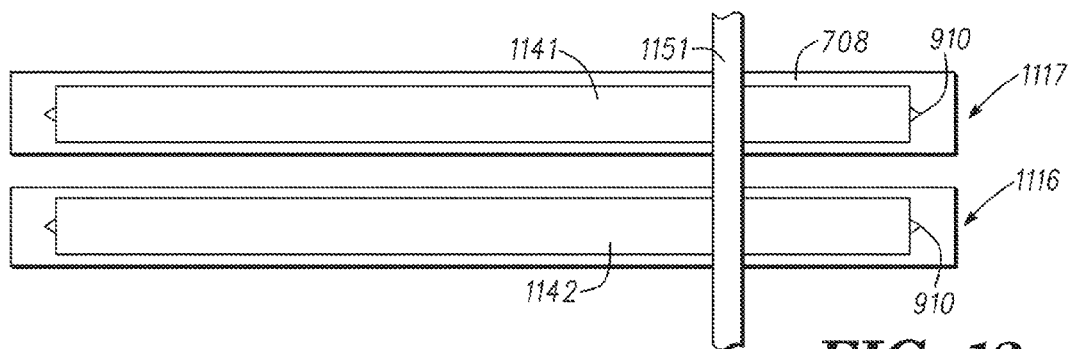
Figure 13:
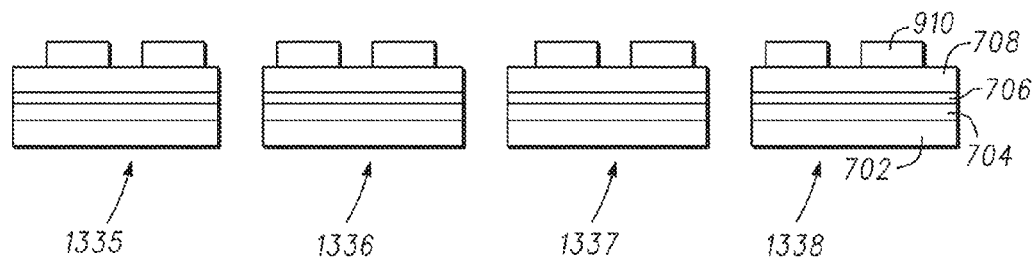
FIGS. 13 and 14 are a partial cross section and a top view, respectively, of a series of steps in the process of forming a second exemplary embodiment.
Figure 14:
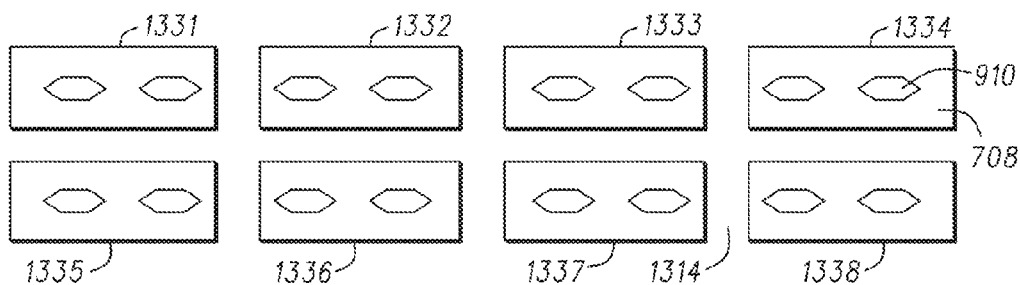
Figure 15:
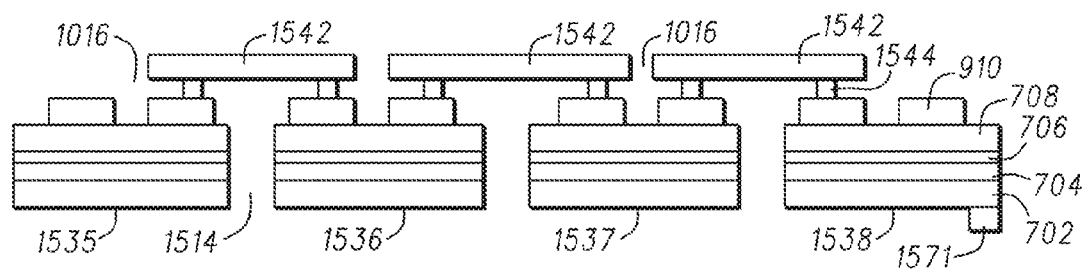
FIGS. 15 and 16 are a partial cross section and a top view, respectively, of a second series of steps in the process of forming second exemplary embodiment.
Figure 16:
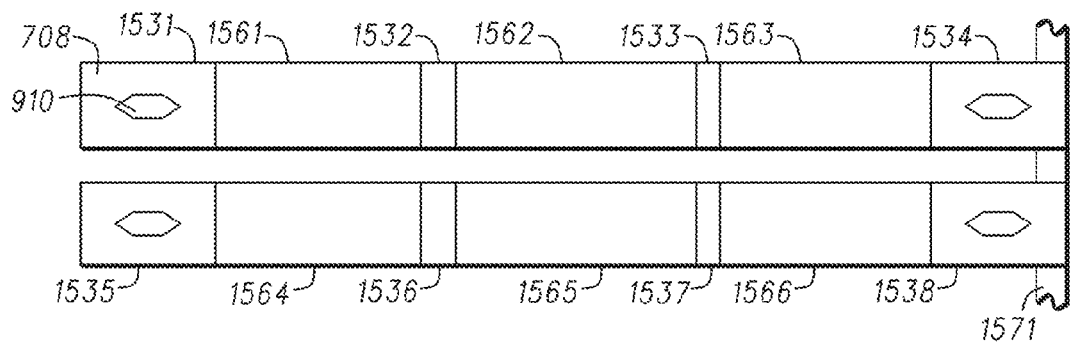

Referring to the partial cross sectional view of FIG. 7 and the top view of FIG. 8, the stack of sensor layers is sequentially formed by depositing a first conductive layer (702) to serve as a lower electrode, one or more pinning layers 704 to pin the lower pinned ferromagnetic layer, a synthetic antiferromagnetic structure (SAF) 706, one or more dielectric layers 708 to serve, after etching, as the tunnel barrier layer, one or more upper ferromagnetic layers 710 to serve, after etching, as the upper sense ferromagnetic layer. Each of the layers may be blanket deposited to a predetermined thickness using known techniques, such as CVD, PECVD, PVD, ALD, IBD, or combinations thereof. In this way, the stack of sensor layers covers the entire wafer so that the stack is formed in the "Sensor 1" area where a first type of sensor (e.g., x-axis sensors) will be formed, and is also formed in the "Sensor 2" area where a second type of sensor (e.g., y-axis sensors oriented 90 degrees from the "Sensor 1") will be formed. In addition, the sensor stack may be formed in "other" areas where a sensor having any desired orientation will be formed.

The electrode 702 is any conductive material such as Cu or Al, but preferably is Ta, TaN or a combination thereof. The pinning antiferromagnetic layer, 704, preferably is PtMn. The SAF 706 may be two ferromagnetic layers (not shown) separated by a non-magnetic antiferromagnetic coupling spacer (not shown) as is well known by those skilled in the art. The tunnel barrier 708 preferably comprises AlOx or MgO.

As will be appreciated, SAF structures, as in SAF 706, with appropriate geometry and materials that provide sufficiently strong (hard) magnetization, the underlying antiferromagnetic pinning layer may not be required, thereby providing a simpler fabrication process with cost savings. For example, a slightly imbalanced SAF (not shown) having two differing ferromagnet layers separated by a Ruthenium spacer layer, where the ferromagnetic layers above and below the ruthenium layer have different magnetic moments. Either or both of the ferromagnetic layers may be formed with CFB (Cobalt Fe Boron) or any desired ferromagnetic alloy. For example, CoFe may be used for the lower layer and CFB may be used for the upper layer in an example embodiment. At certain periodic thicknesses of the Ruthenium spacer layer, the two ferromagnet layers will be exchange coupled so that the anti-parallel state is the low energy state. As a result, the net magnetic moment is minimized and the immunity to external field response is strengthened. With this example SAF structure, a small net moment may be created which will respond to a very large externally applied magnetic field before the SAF is pinned via a high temperature anneal. For a reference layer formed with a SAF that has micron scale dimensions (e.g., greater than (approximately 0.5 um along the short axis and a high aspect ratio of greater than about 3), the magnetization tends to align anti-parallel along the short axis instead of along the long axis, hence the short axis sets the pinning direction. This results from the fact that the lowest energy state is for the two layers to close their magnetic flux along the short axis of the patterned shape. In remanence (e.g., after the setting field is removed), the magnetic moment of the largest moment layer (e.g., the lower pinned layer of 706, FIG. 7 in this example) aligns so that it is along the short axis of the SAF in the direction that has a positive projection onto the setting field angle (see U.S. Patent Publication 2009/0279212, assigned to the assignee of the present invention). Conversely, the magnetic moment of the smaller moment layer (e.g., the upper fixed or reference layer in this example) aligns in the opposite direction from the pinned layer.

The desired pinning direction for the reference layers may be induced by first heating or annealing the wafer below the phase transition temperature of the PtMn in the presence of a saturating field that is oriented between the orientations of the reference layers 706. Subsequently, the saturating field is removed, the temperature is brought above the phase transition temperature to pin the SAF and fix the ferromagnetic reference layer. In a zero or small compensating magnetic field, the magnetic orientation of the reference layer is aligned parallel to the short axis of the patterned magnetic reference layer. By heating the wafer above the phase transition temperature in a zero or small compensating field, the respective shape of the reference layers 706 provides shape anisotropy which in conjunction with the compensating field causes the magnetization of each reference layer to relax and pin along a desired direction. Thus, the magnetization of reference layer 706 follows its shape so that it is aligned parallel to the short axis of the patterned shape. Next, sensor elements 910 (FIGS. 9 and 10) are shaped from the sensor layer 710 by a reactive ion or etch or sputter etch, for example. In this second etch sequence, another photoresist pattern is used to form a patterned hard mask over the parts of the remnant upper ferromagnetic layer(s) layer that will form the sense elements 910. The pattern is selected to define high aspect ratio shapes for the sense elements 910 when a selective etch process (e.g., reactive ion etching) is used to remove all unmasked layers down to and including the unmasked upper ferromagnetic layer 710. In selected embodiments, the selective etch process may leave intact the underlying shaped pinned layers 706, though in other embodiments, the selective etch process also etches the unmasked portions of the underlying shaped pinned layers 706. The defined high aspect ratio shapes for the sense elements 910 are oriented so that they are longer in the dimension of the desired magnetization than they are wide. In other words, the long axis for each sense element 910 is drawn along the desired magnetization direction for a single ferromagnetic sense layer. In addition to being formed as long and narrow shapes, additional shaping of the ends of sense elements may be provided so that each of the sense elements performs more like a single magnetic domain. For example, the sense elements may be shaped to have pointed ends that taper in the corresponding directions of desired easy axis. Once the shaped sense elements are formed, the desired easy axis magnetic orientations may be induced from their shape anisotropy by briefly annealing the wafer (e.g., at an anneal temperature of approximately 250 degrees C.). in the absence of a magnetic field to remove material dispersions. Upon cooling, the magnetizations of the sense layers 910 align with the individual pattern, providing multiple orientations of sense layers. This brief anneal may be included as part of the subsequent wafer processing such as a pre-CMP copper anneal for upper interconnect layers.

A plurality of conductors 1141, 1142 are deposited (FIGS. 11 and 12), one each over each of two groups of sense elements 1116, 1117, thereby coupling the magnetic tunnel junction devices 1116 within a group in parallel between the conductors 1141-1142 and the electrode 702.

These parallel coupled sense elements 1116 may be coupled in series with the groups 1117 by conductor 1151.

This embodiment enables many sense elements to be connected in parallel between the electrodes, allowing noise averaging at the device level between the sense elements, increasing the SNR. Since multiple sense elements are stacked on a single reference electrode, they may be packed much more densely than would be otherwise possible given the design rules for sense element to lower electrode overlay and lower electrode spacing.

In a second exemplary embodiment, referring back to FIGS. 7-10, a chemical etch is performed through the sense layer 710, the tunnel barrier 708, the SAF 706, and at least to the pinning layer 704, to create an opening 714 (FIG. 8), but could be partially or completely through the pinning layer 704. The pinned reference layer 704 is formed with a single patterned ferromagnetic layer having a magnetization direction 703 (FIG. 8) that aligns along the short-axis of the patterned reference layer(s). The synthetic anti-ferromagnetic (SAF) layer 706 aligns the magnetization of the pinned reference layer along the short axis of the patterned reference layer(s). In a first etch sequence, the shapes of the different pinning layer 704 are defined by using patterned photoresist to form a first patterned hard mask and then performing a selective etch process (e.g., reactive ion etching) to remove all unmasked layers down to and including the unmasked lower ferromagnetic layer(s). The resulting shapes of the etched lower ferromagnetic layers are oriented so that each pinned layer has shape anisotropy, resulting in a preferred magnetic orientation along one of its axes.

The resulting shapes of the etched lower ferromagnetic layers are oriented so that each pinned layer has shape anisotropy, resulting in a preferred magnetic orientation along one of its axes as disclosed above. Once the magnetic reference angle has been set, it is not necessary to preserve the high aspect ratio of the pinned magnetic layer since the magnetization is no longer free to move. As the pinned layer and lower electrode also serve as the electrical interconnection path, when only considerations of its magnetic behavior are taken into account in the device design, the optimal sense element density and device performance may not be realized. When the tunnel junctions are further separated into groups via subsequent patterning of the lower electrode, very close to the ideal electrical pattern and packing densities may also be utilized. The shape dependent magnetic function to determine sensor reference angle of the lower electrode has already been performed.

Figure 17:
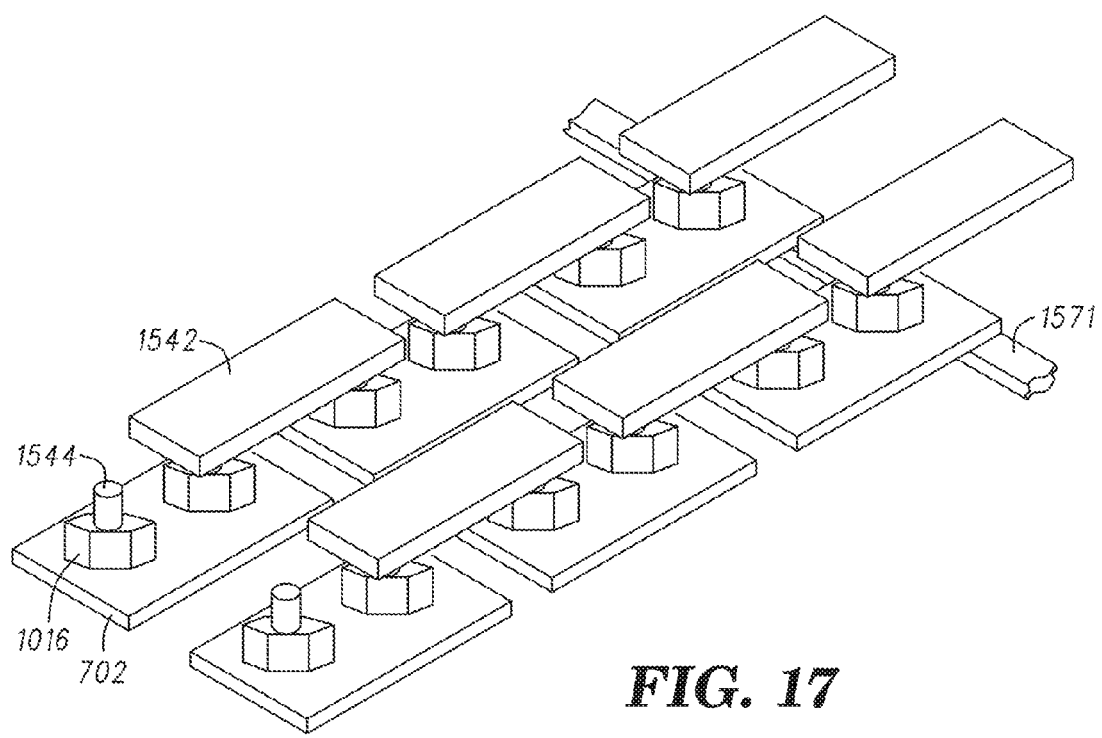
FIG. 17 is a perspective view of the second exemplary embodiment.

Then subsequent to the sense elements 910 and dielectric layer 708 being etched to define the sense element shapes, a further chemical etch (FIGS. 13-14) is performed through the SAF 706, the pinning layer 704, and the lower electrode to create openings 1314 and create subgroups 1331-1338 of sense elements. These subgroups are connected together in groups (FIG. 15-16) for ideal electrical performance by interconnection with optional vias 1544 and an upper local interconnect layer 1542. A plurality of conductors 1561-1568 are formed over certain of the sensor elements 910, coupling a sense element from one subgroup to a sense element of another subgroup in series. For example, conductor 1561 couples a sense element 910 in subgroup 1531 to a sensor element 910 in subgroup 1532. This structure couples the magnetic tunnel junctions 1016 in subgroups 1531, 1532, 1533, 1534 in series, and the subgroups 1535, 1536, 1537, 1538 in series. These series coupled subgroups 1531-1538 may then be coupled in parallel by the conductor 1571. FIG. 17 shows a perspective view of the sense element array.

Figure 18:
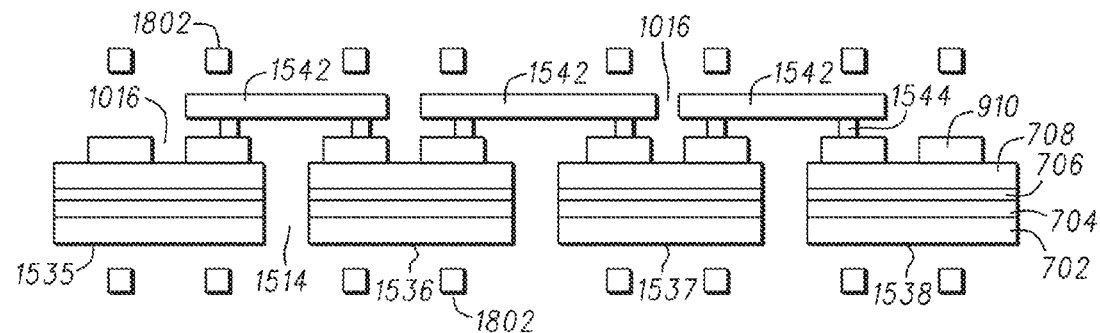
FIGS. 18 and 19 are a partial cross section and a top view, respectively, of a third series of steps in the process of forming second exemplary embodiment.
Figure 19:
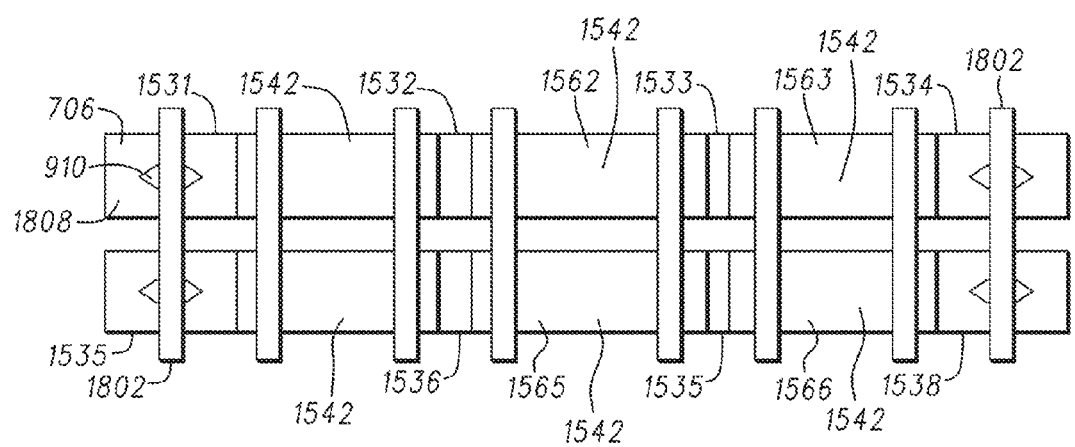

Referring to FIGS. 18 and 19, a plurality of conductive stabilization lines 1802 are formed near the sense elements 910. As shown, the conductive stabilization lines 1802 are preferably formed on two opposed sides of the sense elements 910, but may be formed on only one side. To prepare the sense elements for field measurement, an orienting field pulse is applied along the stabilization path. This reset may be periodic, precede each measurement, or only occur when an error condition (very high bridge offset indicating misorientation, linearity errors, or high noise condition) is encountered. As the individual sense element anisotropy is large compared with the stabilization field that must be applied for noise optimization but on the same order as the field required to reorient the sense element, the magnitude of the orientation field pulse is much larger than that applied during the measurement phase for sensor stabilization. Without hard bias stabilization or a measurement preparation capability, a momentary exposure to a large field may reorient the magnetization of the sense elements in a poorly determined state. Subsequent to the preparation phase (application of the stabilization current), all line segments within a bridge or sense axis are connected in series, and stabilization current is applied to these segments and a measurement may proceed.

This combination of series and parallel wiring provides the highest sense element packing density, while simultaneously allowing freedom to create a device with arbitrary final resistance to provide optimal combination of device parameters such as impedance for minimal power consumption, low Johnson and shot noise, and best CMOS impedance matching. The inner series wiring is further beneficial in that a low resistance sense element will not contribute too greatly to the overall device resistance as its impact is diminished by the other series connected members. Such is not the case with the inner parallel wiring required for a single patterning of the lower electrode.

Figure 20:
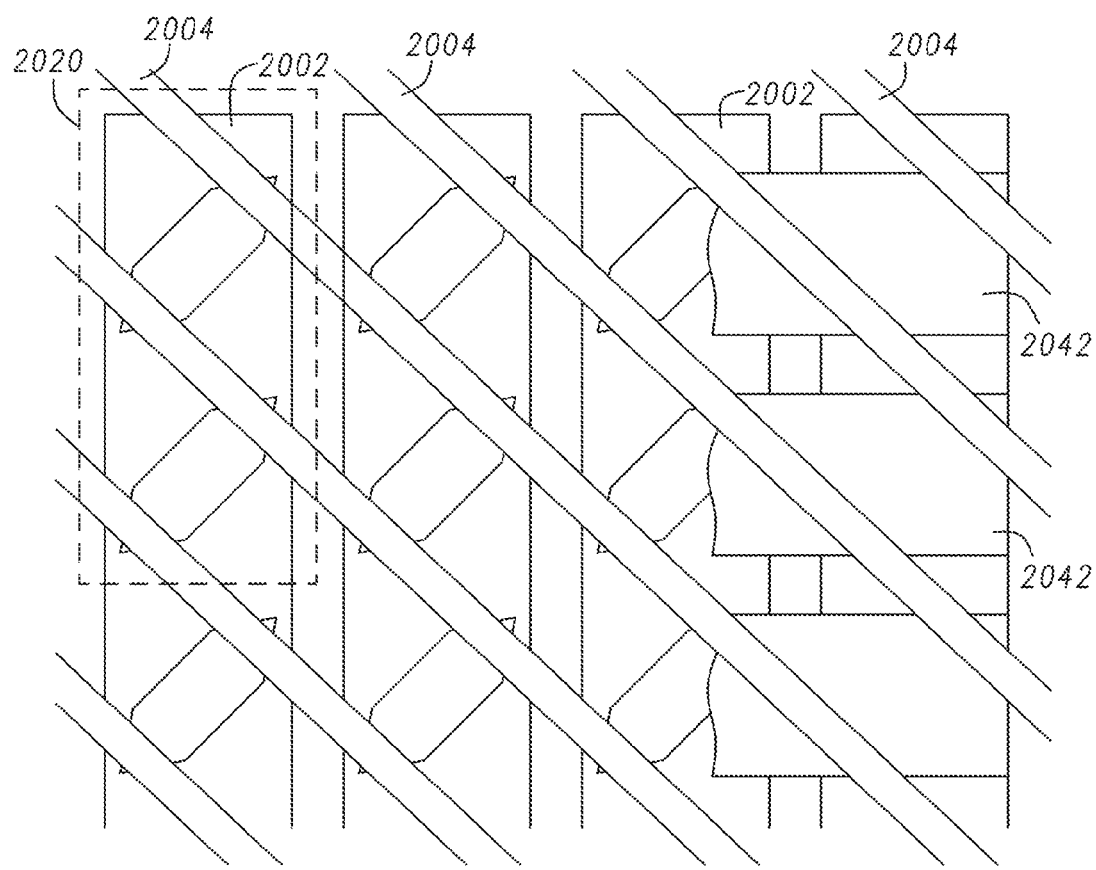
FIG. 20 is a top view of the third exemplary embodiment.
Figure 21:
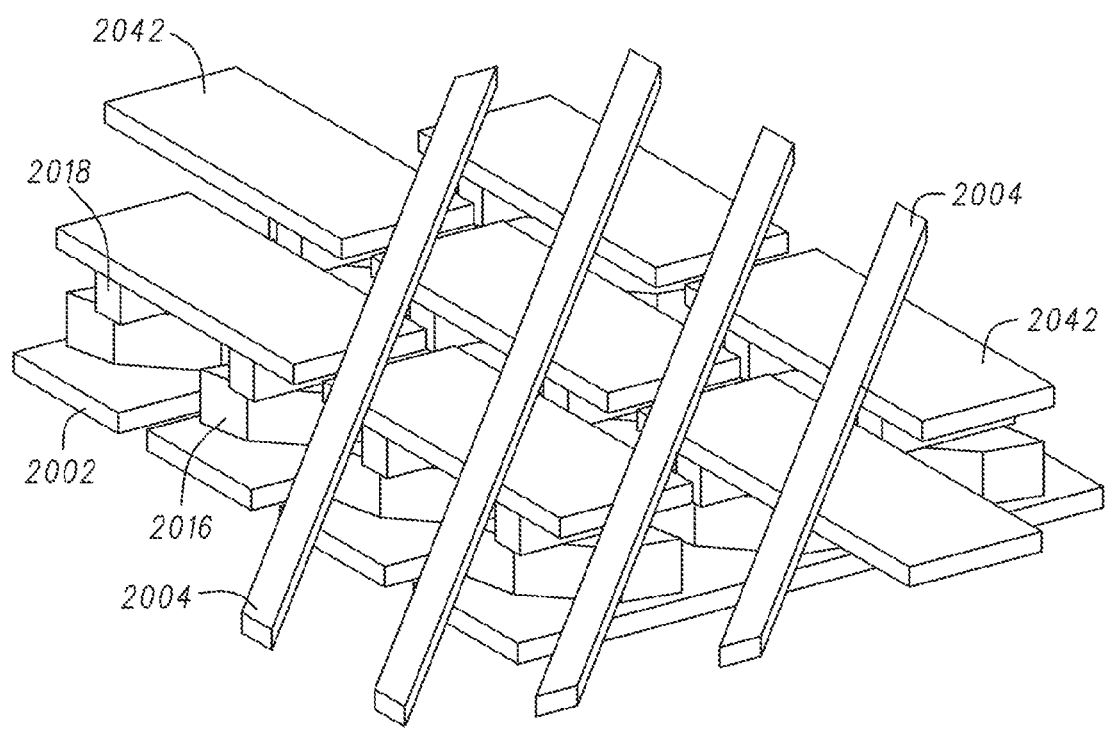
FIG. 21 is a perspective view of the third exemplary embodiment.

FIGS. 20 and 21 illustrate a third exemplary embodiment wherein the magnetic tunnel junctions 2016 are positioned between conductive lines 2002 and 2042 and the adjacent stabilization lines 2004. The conductive line 2042 is coupled to the sense elements 2016 by a via 2018, and the sense array is optimally sized for highest possible signal-to-noise (SNR) while allowing the available voltage supply to stabilize the sensors with the required current during the measurement phase. Two or more copper lines (or parallel connected series of line segments) are routed adjacent each sense element to maintain the relative orientations between sense and reference layer anisotropy axes while maximizing the packing densities of the sense elements, thereby allowing for a larger number of sense elements 2016 to be stabilized with a fixed line length or a fixed maximal stabilization line 2004 resistance. Taken alone, the array pitch of the line segments 2004 and the sense elements 2016 are not identical, but take the relationship that there are multiple sense elements 2016 and stabilization line segments 2004 per unit cell (magnetic tunnel junction) 2020. When this cell 2020 is arrayed out, the continuous stabilization line 2004 that is formed from the abutting of adjacent cells 2020, stabilizes one section of a sense element 2016 in the first pass proximal to sense element 2016, and then different section of the adjacent (proceeding along the stabilization line 2004 routing direction) sense element 2016. Therefore, each stabilization line segment 2004 within a given unit cell 2020 is used to stabilize more than one sense element 2016, and a substantially increased packing density results. Therefore, a higher number of sense elements 2016 may be placed within a fixed die space, or the sensor die size may be further reduced while the signal to noise ratio is simultaneously increased.

Figure 22:
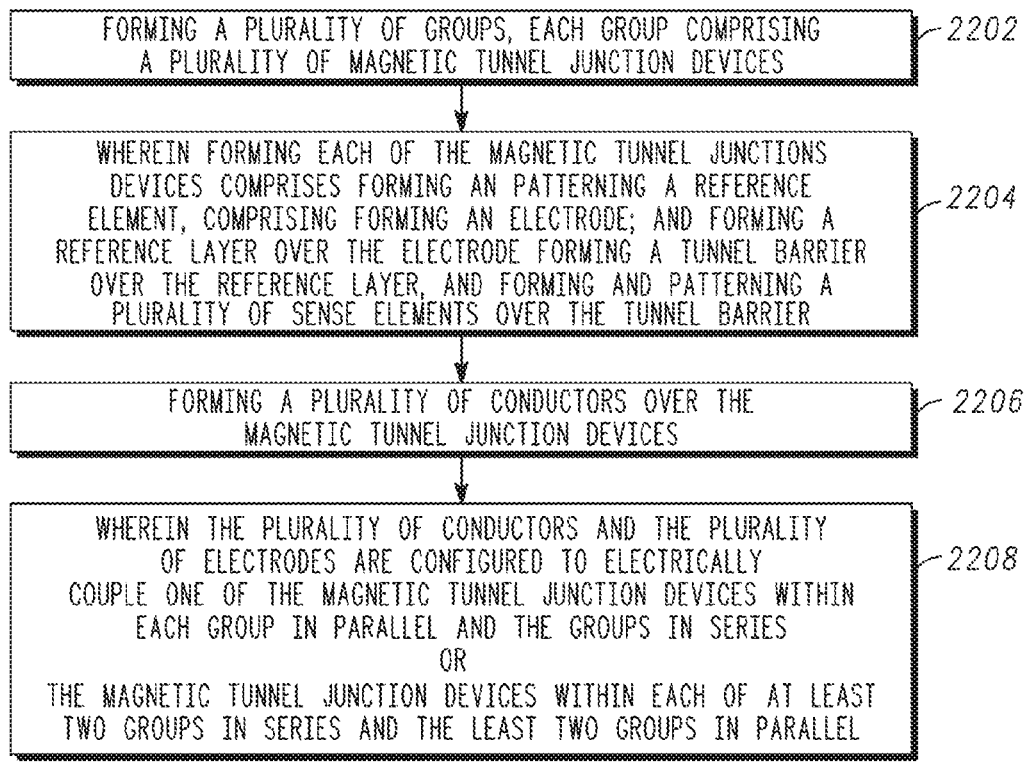
FIG. 22 is a flow chart of the method in accordance with the exemplary embodiments.

FIG. 22 is a flow chart that illustrates a process of fabricating the exemplary embodiment. It should be appreciated that process 2200 may include any number of additional or alternative tasks, the tasks shown in FIG. 22 need not be performed in the illustrated order, and process 2200 may be incorporated into a more comprehensive procedure or process having additional functionality not described in detail herein. Moreover, one or more of the tasks shown in FIG. 22 could be omitted from an embodiment of the process 2200 as long as the intended overall functionality remains intact.

The process 2200 of fabricating a magnetic sensor includes forming 2202 a plurality of groups, each comprising a plurality of magnetic tunnel junction devices, wherein forming each of the magnetic tunnel junction devices comprises forming and patterning 2204 a reference element comprising forming an electrode and forming a reference layer over the electrode, forming a tunnel barrier over the reference layer, and forming and patterning a plurality of sense elements over the tunnel barrier; and forming 2206 a plurality of conductors over the magnetic tunnel junction devices, wherein the plurality of conductors and the plurality of electrodes are configured 2208 to electrically couple one of the magnetic tunnel junction devices within each group in parallel and the groups in series; or the magnetic tunnel junction devices within each of at least two groups in series and the at least two groups in parallel.

By now it should be appreciated that there has been provided a magnetic field sensor apparatus and a method of manufacturing a plurality of differential sensor circuits over a substrate which detects an applied magnetic field directed along a one or more axis. The differential sensor circuits may be constructed as Wheatstone bridge structures, one array of sense elements for each axis to be sensed, of unshielded magnetic tunnel junction (MTJ) sensors formed with a plurality of pinned layers that are each magnetized in a single pinned direction and a corresponding plurality of unshielded sense layers. In an example implementation, the differential sensor circuit includes a first unshielded MTJ sensor having a first unshielded sense layer with a first easy axis magnetic orientation, and a second unshielded MTJ sensor having a second unshielded sense layer with a second easy axis magnetic orientation, where the first and second easy axis magnetic orientations are deflected equally and in opposite directions (e.g., ±135 degrees) from the single pinned direction. When each unshielded sense layer is formed to have an anisotropic axis with a longer length dimension and a shorter width dimension, the longer length dimension is aligned with an easy axis magnetic orientation for the unshielded sense layer. In selected embodiments, multiple sense elements are positioned on each patterned reference layer strip, allowing for closer sense element pitch and higher aspect ratio of the reference layer; hence better magnetic characteristics of that reference layer for a remnant field setting process. In another embodiment, after the remnant magnetic field setting procedure is complete and the high aspect ratio, narrow (1-3 um) reference layer has been utilized, the sense elements are patterned and then the reference layer is reshaped and cut into segments to allow a series wiring of the sense elements in conjunction with an upper conducting layer. Each magnetic field sensor includes an embedded magnetic field generator disposed near each unshielded sense layer that is positioned to generate a magnetic field pulse that is aligned with an easy axis magnetic orientation for each unshielded sense layer. In selected embodiments, the embedded magnetic field generator is implemented as a conductive line positioned to conduct a current pulse that creates a magnetic field pulse for resetting a magnetic orientation of an associated unshielded sense layer, and/or to apply a weak magnetic field along an easy axis magnetic orientation for each unshielded sense layer. In selected embodiments, the X and Y pitch of the sense elements are arranged such that the line segment that stabilizes, for example, the right side of one sense element; also stabilizes the left side of the adjacent sense element. The sense layers within each magnetic field sensor are grouped, wherein each group sequentially receives a current pulse. By providing a current pulse sequentially to these groups, the line resistance is reduced, allowing for a larger current with the given voltage.

Although the described exemplary embodiments disclosed herein are directed to various sensor structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may vary. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A magnetic field sensor, comprising:
a first plurality and a second plurality of magnetoresistive sensors, wherein each magnetoresistive sensor of the first plurality and the second plurality of magnetoresistive sensors comprises:
an electrode;
a reference layer adjacent to the electrode, wherein the reference layer includes a synthetic antiferromagnetic structure;
a magnetic sense element; and
an intermediate layer between the reference layer and the magnetic sense element; and
one or more conductors configured to:
electrically couple together (a) in series each magnetoresistive sensor of the first plurality of magnetoresistive sensors, (b) in series each magnetoresistive sensor of the second plurality of magnetoresistive sensors, and (c) in parallel the first plurality and the second plurality of magnetoresistive sensors; or
electrically couple together (a) in parallel each magnetoresistive sensor of the first plurality of magnetoresistive sensors, (b) in parallel each magnetoresistive sensor of the second plurality of magnetoresistive sensors, and (c) in series the first plurality and the second plurality of magnetoresistive sensors.

2. The magnetic field sensor of claim 1, wherein the one or more conductors comprise:
a first conductor electrically coupled to the magnetic sense elements of the first plurality of magnetoresistive sensors;
a second conductor electrically coupled to the magnetic sense elements of the second plurality of the magnetoresistive sensors; and
a third conductor electrically coupled to the first and second conductors.

3. The magnetic field sensor of claim 1, wherein the one or more conductors comprise:
a first conductor electrically coupled to at least one magnetic sense element of the first plurality of the magnetoresistive sensors;
a second conductor electrically coupled to at least one magnetic sense element of the second plurality of the magnetoresistive sensors; and
a third conductor electrically coupled to the first and second conductors.

4. The magnetic field sensor of claim 1, further comprising:
a stabilization conductor formed adjacent to each magnetoresistive sensor in the first plurality and the second plurality of magnetoresistive sensors,
wherein the stabilization conductor is configured to stabilize (a) a first portion of a first magnetoresistive sensor of the first plurality of magnetoresistive sensors, and (b) a second portion of a second magnetoresistive sensor adjacent to the first magnetoresistive sensor.

5. The magnetic field sensor of claim 1, further comprising:
at least one stabilization line segment positioned adjacent to the magnetic sense element of each magnetoresistive sensor in the first plurality and the second plurality of magnetoresistive sensors, wherein the at least one stabilization line segment is configured to maintain a magnetic orientation between an anisotropy axis of a magnetic sense element and an anisotropy axis of a corresponding reference layer.

6. The magnetic field sensor of claim 1, wherein, when the first plurality and the second plurality of magnetoresistive sensors are electrically coupled in series, the first plurality and the second plurality of magnetoresistive sensors form a half Wheatstone bridge; and
wherein, when the first plurality and the second plurality of magnetoresistive sensors are electrically coupled in parallel, the first plurality and the second plurality of magnetoresistive sensors form a Wheatstone bridge.

7. The magnetic field sensor of claim 1, wherein a magnetic direction of the synthetic antiferromagnetic structure is pinned using a shape dependent magnetization setting angle.

8. The magnetic field sensor of claim 1, wherein each magnetoresistive sensor is a magnetic tunnel junction sensor.

9. The magnetic field sensor of claim 1, wherein the intermediate layer includes an insulating dielectric material.

10. A magnetic field sensor, comprising:
a plurality of magnetoresistive sensors including a first group of magnetoresistive sensors and a second group of magnetoresistive sensors, wherein each magnetoresistive sensor comprises:
a reference element comprising:
an electrode; and
a reference layer adjacent the electrode, wherein the reference layer includes a synthetic antiferromagnetic structure;
a magnetic sense element; and
an intermediate layer between the reference element and the magnetic sense element;
a conductor formed adjacent to each magnetoresistive sensor of the plurality of magnetoresistive sensors, wherein the conductor and electrode of each magnetoresistive sensor in the first and second groups of magnetoresistive sensors are configured to:
electrically couple (a) the magnetoresistive sensors within the first and second groups in parallel and (b) the first and second groups in series; or
electrically couple (a) the magnetoresistive sensors within the first and second groups in series and (b) the first and second groups in parallel.

11. The magnetic field sensor of claim 10, wherein the conductor comprises:
a first conductor electrically coupled to the magnetoresistive sensors in the first group of magnetoresistive sensors;
a second conductor electrically coupled to the magnetoresistive sensors in the second group of magnetoresistive sensors; and
a third conductor electrically coupled to the first and second conductors.

12. The magnetic field sensor of claim 11, wherein the first conductor is coupled to the magnetic sense element of each magnetoresistive sensor in the first group of magnetoresistive sensors, and wherein the second conductor is coupled to the magnetic sense element of each magnetoresistive sensor in the second group of magnetoresistive sensors.

13. The magnetic field sensor of claim 10, further comprising:
a stabilization conductor formed adjacent to each magnetoresistive sensor in the plurality of magnetoresistive sensors, wherein the stabilization conductor is configured to stabilize (a) a first portion of a first magnetoresistive sensor in the plurality of magnetoresistive sensors, and (b) a second portion of a second magnetoresistive sensor adjacent to the first magnetoresistive sensor.

14. The magnetic field sensor of claim 10, further comprising:
at least one stabilization line segment adjacent to the magnetic sense element of each magnetoresistive sensor in the plurality of magnetoresistive sensors, wherein the at least one stabilization line segment is configured to maintain a magnetic orientation between an anisotropy axis of a magnetic sense element and an anisotropy axis of a corresponding reference layer.

15. The magnetic field sensor of claim 10, wherein the plurality of magnetoresistive sensors further includes a third group of magnetoresistive sensors and a fourth group of magnetoresistive sensors,
wherein the first and second groups of the magnetoresistive sensors are electrically coupled in series,
wherein the third and fourth groups of the magnetoresistive sensors are electrically coupled in series, and
wherein the first and second groups are electrically coupled in parallel with the third and fourth groups to form a Wheatstone bridge.

16. The magnetic field sensor of claim 10, wherein, when the first and second groups of magnetoresistive sensors are electrically coupled in series, the first and second groups of magnetoresistive sensors form a half Wheatstone bridge; and
wherein, when the first and second groups of magnetoresistive sensors are electrically coupled in parallel, the first and second groups of magnetoresistive sensors form a Wheatstone bridge.

17. The magnetic field sensor of claim 10, wherein a magnetic direction of the synthetic antiferromagnetic structure is pinned using a shape dependent magnetization setting angle.

18. The magnetic field sensor of claim 10, wherein each magnetoresistive sensor is a magnetic tunnel junction sensor.

19. The magnetic field sensor of claim 10, wherein the intermediate layer includes an insulating dielectric material.

20. A magnetic field sensor, comprising:
a first plurality and a second plurality of magnetoresistive sensors, wherein each magnetoresistive sensor of the first plurality and the second plurality of magnetoresistive sensors comprises:
an electrode;
a pinning layer
a reference layer, wherein the reference layer includes a synthetic antiferromagnetic structure;
a magnetic sense element; and
one or more conductors configured to:
electrically couple together (a) in series each magnetoresistive sensor of the first plurality of magnetoresistive sensors, (b) in series each magnetoresistive sensor of the second plurality of magnetoresistive sensors, and (c) in parallel the first plurality and the second plurality of magnetoresistive sensors; or
electrically couple (a) in parallel each magnetoresistive sensor of the first plurality of magnetoresistive sensors, (b) in parallel each magnetoresistive sensor of the second plurality of magnetoresistive sensors, and (c) in series the first plurality and the second plurality of magnetoresistive sensors.

21. The magnetic field sensor of claim 20, wherein each magnetoresistive sensor includes an insulating material between the magnetic sense element and the reference layer.

22. The magnetic field sensor of claim 20, wherein each magnetoresistive sensor is a magnetic tunnel junction sensor.

* * * * *